United States Patent [19]
Stokes

[11] Patent Number: 6,051,987
[45] Date of Patent: Apr. 18, 2000

[54] APPARATUS AND METHOD FOR DETECTION OF RESIDUAL MAGNETIC FIELDS IN DYNAMOELECTRIC MACHINES

[76] Inventor: Robert Stokes, Rte. 2, Box 75B, Hughes Springs, Tex. 75656

[21] Appl. No.: 08/844,011

[22] Filed: Apr. 18, 1997

[51] Int. Cl.[7] .................................................. G01R 31/34
[52] U.S. Cl. ........................................................... 324/772
[58] Field of Search ..................... 324/772, 545, 324/546; 318/490; 340/648

[56] References Cited

U.S. PATENT DOCUMENTS

| | | | |
|---|---|---|---|
| 2,644,922 | 7/1953 | Sewell | 324/47 |
| 3,054,947 | 9/1962 | Kass et al. | 324/51 |
| 3,967,199 | 6/1976 | Knoop et al. | 324/772 |
| 4,527,123 | 7/1985 | Gilman et al. | 324/254 |
| 4,658,213 | 4/1987 | Finley | 324/158 |
| 4,864,238 | 9/1989 | Seitz | 324/253 |
| 5,017,877 | 5/1991 | Haus, Jr. | 324/546 |
| 5,045,779 | 9/1991 | Herrick et al. | 324/158 |
| 5,420,523 | 5/1995 | Walker et al. | 324/772 |
| 5,446,389 | 8/1995 | Lenz | 324/555 |

*Primary Examiner*—Walter E. Snow
*Attorney, Agent, or Firm*—Locke Liddell & Sapp LLP

[57] ABSTRACT

Apparatus and method to determine the intensity of a residual magnetic field that accumulates on the rotor of a dynamoelectric machine to identify stator and rotor anomalies. A dynamoelectric machine, such as an induction motor, has a rotor which becomes magnetized with use. This magnetism tends to skew inductance tests which are used to predict problems developing within the motor. The apparatus and method measure the accumulated magnetic field of a motor rotor, and adjust conventional inductance tests to yield more accurate results.

19 Claims, 4 Drawing Sheets

APPARATUS AND METHOD FOR DETECTION OF RESIDUAL MAGNETIC FIELDS IN DYNAMOELECTRIC MACHINES

FIELD OF THE INVENTION

The present invention relates generally to the field of testing dynamoelectric machines, such as electric motors and generators, and more specifically to a method and apparatus for determining the intensity of a residual magnetic field that accumulates on the rotor of an induction motor. The residual field indicator has particular utility in connection with testing to determine whether a motor may be subject to premature failure.

BACKGROUND OF THE INVENTION

Dynamoelectric machines, such as electric motors and generators, which convert electrical energy into mechanical power and mechanical energy into electrical power, respectively, comprise a stationary member, also called a stator or field, and a rotating member, also called a rotor or armature. The stator and rotor each have a magnetic structure. An electric motor employs electricity to create a magnetic charge on the magnetic structure of the stator, which in turn causes the rotor to rotate, creating mechanical power. The magnetic structure of both the stator and rotor employ a conductor, usually aluminum, and thin laminations or poles, usually made of steel. The production and wear of stators and rotors can cause a number of weaknesses or faults, including shaft wobble, magnetic centering, worn bearings, pole distortions, electrical shorts in motor windings, leakage between windings and porosity or impurities in the magnetic structures, which can detrimentally affect output and reliability.

Various technologies are known in the art to minimize the negative impact motor failures have on the safety, reliability, and production of motors. While some of these known methods have employed undesirable destructive testing techniques, others use non-destructive techniques to test stators and rotors for defects. One such test measures inductance versus rotor position. According to this test, the rotor is slowly turned while a known electrical signal is applied to the inductive windings of a motor. The known signal is reflected as an electromagnetic field. The manner in which characteristics, such as frequency, amplitude and waveform, of an applied field are reflected represents an electromagnetic signature of a particular motor. This electromagnetic signature is analyzed to detect dissymmetries, which can be used to predict defects in the motor. The electromagnetic signature can also be chronicled against historical motor data to predict future motor failures.

Systems are known in the art that employ portable computers to map, record and analyze the reflected electromagnetic signatures. This use of an electromagnetic signature to determine potential problems before motor failure results in reduced downtime, and is analogous to catscans or magnetic resonance images which are used to determine potential health problems in humans. However, the longer a motor is used, the longer the stator and rotor are magnetized, resulting in the creation of residual magnetic fields on the magnetic structures of the stator and motor. Therefore, the base inductance of a motor increases over its lifecycle. Residual magnetic fields can be substantial in large dynamoelectric machines such as motors larger than 100 horsepower. Current inductance tests are based on data garnered from the observation of small motors, where the residual magnetism of the stator and rotor is not large enough to skew tests.

Current inductance tests and devices are skewed by the lack of residual magnetic field correction, and therefore tend to overidentify older machines, particularly large motors, as problematic. Existing test procedures recognize that an offset problem exists, but rather than incorporating a solution, such procedures initialize the test with the rotor in the same position each time: for example, consistently starting with the rotor key notch in an upright position. This allows consistency when multiple tests are conducted within a short period of time on the same motor. However, this procedure does not allow for comparison tests between similar motors as the residual magnetic field of every motor varies. Further, as the residual magnetic field increases with use, the test history of a particular motor cannot be reliably chronicled.

A need exists for a simple and inexpensive device that can reliably detect the residual magnetic field of a motor, allowing for more accurate determination of stator and rotor anomalies.

SUMMARY OF THE INVENTION

The apparatus of the present invention overcomes the above-mentioned disadvantages and deficiencies which are characteristic of the prior art. The present invention is based on the recognition that rotors and stators of large dynamoelectric machines, such as motors larger than 100 horsepower, are prone to become magnetized over time. To alleviate the deficiencies of current inductance tests, the apparatus of the present invention enables the measurement of the residual magnetic field present in a machine to generate a relative baseline residual magnetic field prior to performing a conventional inductance test. This allows the absolute reading given by an inductance test to be adjusted by the relative baseline residual magnetic field.

The apparatus of the present invention allows the measurement of the residual electromagnetic field with respect to rotation of a motor rotor. In a preferred embodiment, a motor to be tested is attached as a load across the residual magnetic field indicator. A constant, single-phase square-wave voltage is applied to selected lines of the motor, causing selected coils of the motor to be charged. Any increase in power output from the value expected by the constant voltage input is caused by a residual magnetic field. The residual magnetic field indicator has a digital meter to display the magnetic field observed while the motor rotor is turned. The observed field is recorded with respect to the rotation of the rotor. The extreme readings on the digital meter are of particular interest as they represent the peaks and poles of the residual magnetic field. After all readings are recorded, the motor being tested is connected to a standard inductance test device. The motor rotor is once again rotated, causing fluctuations in inductance. These fluctuations are primarily caused by the residual magnetic field. The observed extreme values of the residual magnetic field can be identified as peaks or poles by respective apogees and valleys of inductance. This allows the polarity of the residual magnetic field to be determined, and the field may be charted on a polar graph or Smith chart. The results of an inductance test may then be adjusted accordingly, allowing for a more accurate test.

The device of the present invention allows a residual magnetic field to be readily identified and measured. According to a preferred embodiment of the present invention, the residual field indicator is portable, and particularly suitable for synchronous motors which employ round rotors. The residual field indicator comprises an electronic circuit, a machine interface, a digital liquid crystal diode (LCD) meter and a power supply. The electronic circuit of the indicator employs a square wave oscillator coupled between a frequency selection circuit and an amplifier. The frequency selection circuit allows the frequency of the oscillator to be selected from a plurality of frequencies. The meter and machine interface are attached to the output of the amplifier. The machine interface is connected to the output of the amplifier in a manner that permits the response of the machine to the amplified square wave signal of the oscillator to influence the amplifier, thereby supplying feedback which is monitored by the meter. The power supply is attached to the electronic circuit and may be a battery or an AC power source. In a preferred embodiment the device of the present invention includes both a battery and an AC power source and allows a user to select which power source to use. Preferably, the battery is rechargeable, and the indicator further comprises a battery charger to recharge the battery whenever the device is connected to an AC power source.

Additional features and advantages of the present invention will be readily apparent to those of ordinary skill in the art upon a reading of the following detailed description of presently preferred, but nonetheless illustrative, embodiments of the present invention when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings.

DESCRIPTION OF THE PREFERRED EMBODIMENTS

Figure 1:
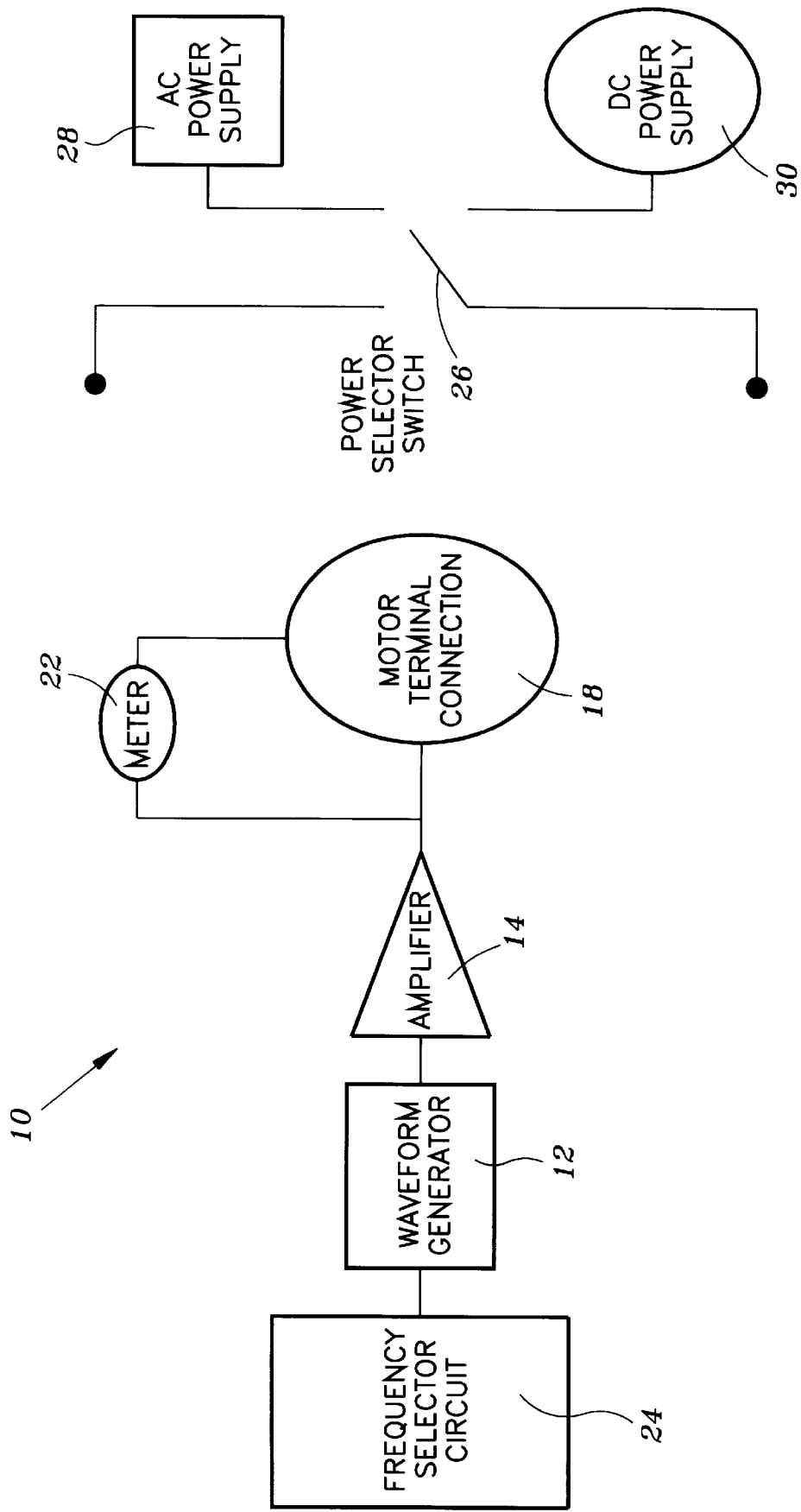
FIG. 1 is a block representation of a residual magnetic field indicator according to the present invention.
Figure 2:
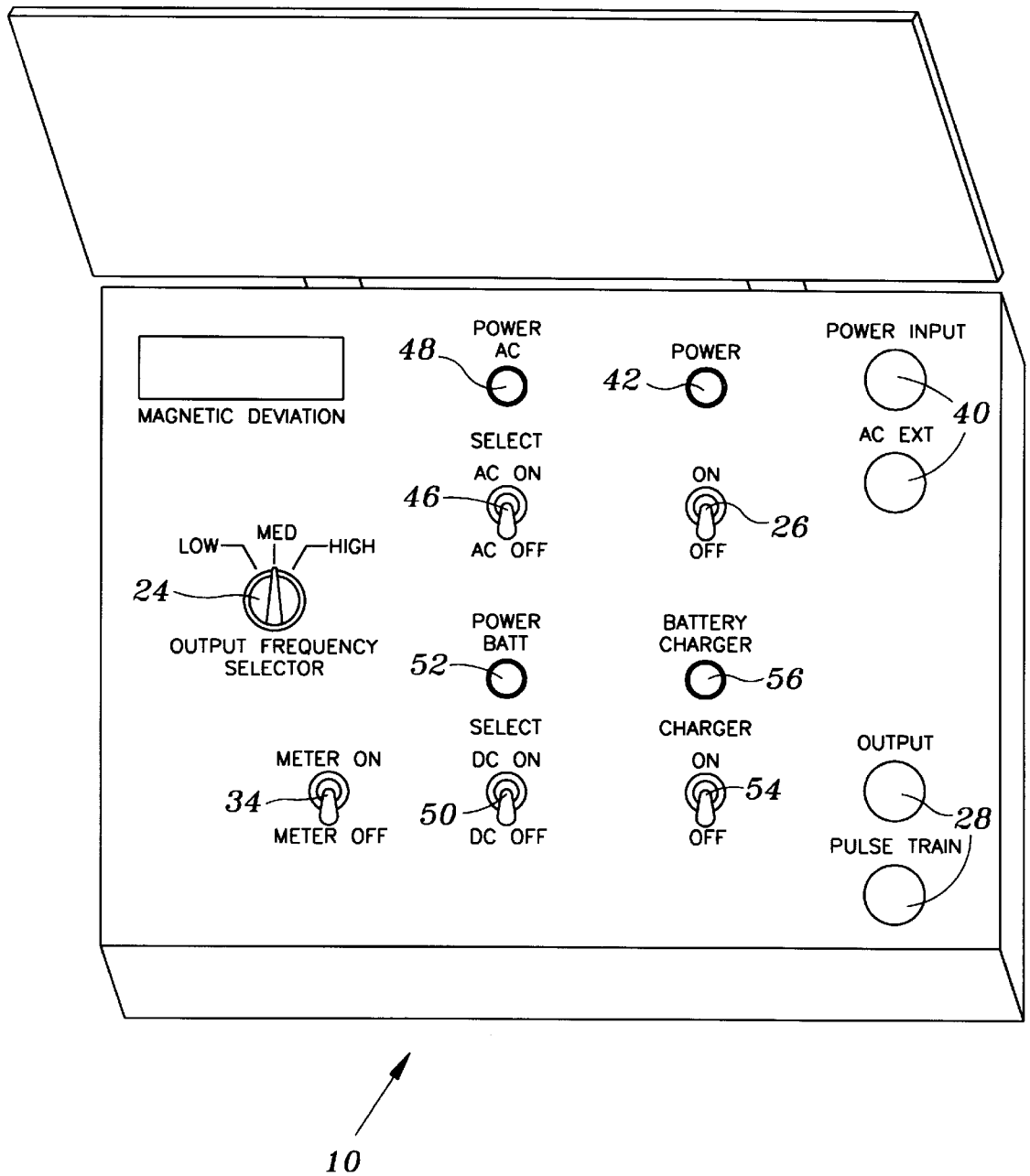
FIG. 2 is an external view of a residual magnetic field indicator according to the present invention.
Figure 3:
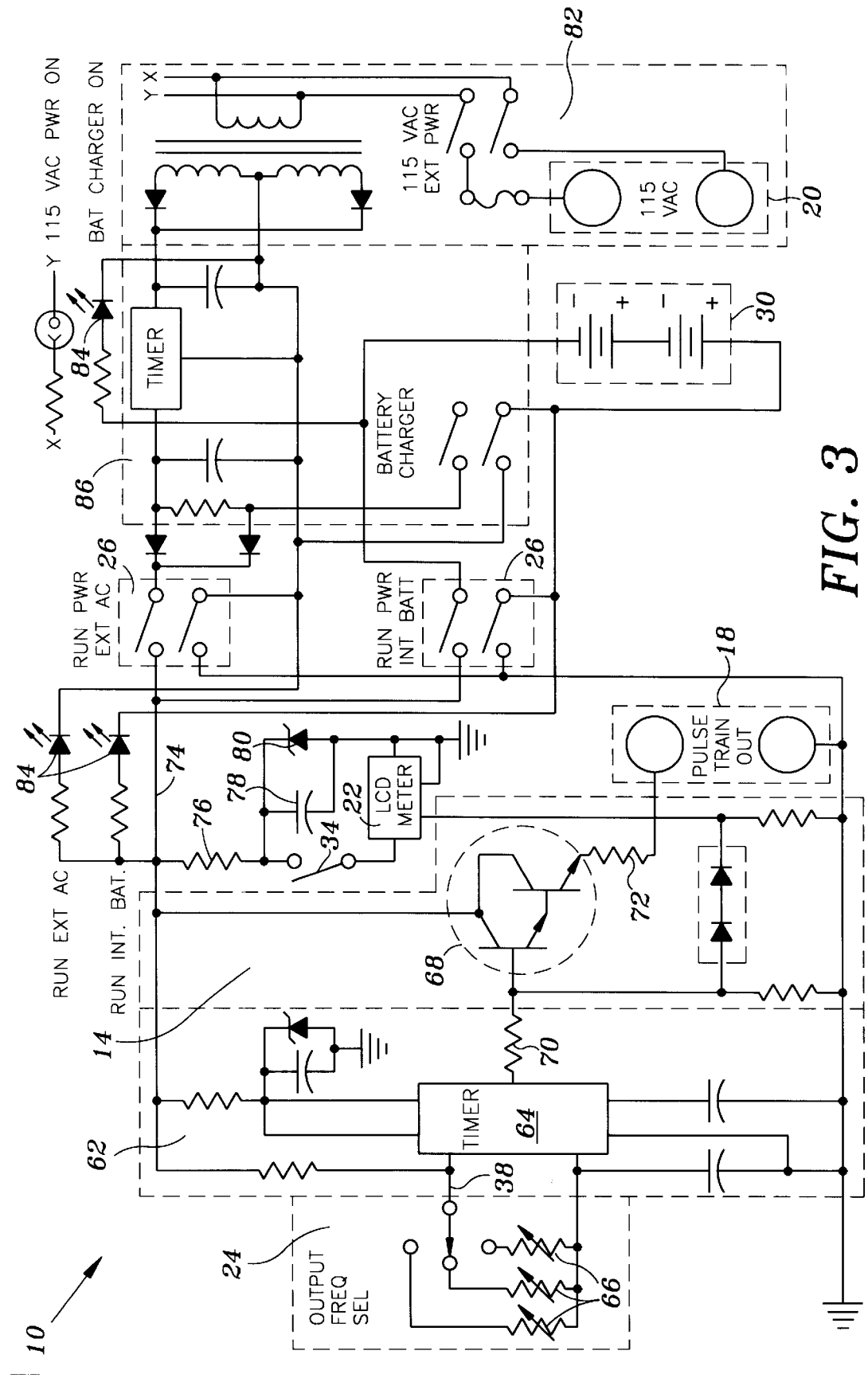
FIG. 3 is a detailed schematic drawing of the residual magnetic field indicator of the present invention.

Referring now to the drawings, and particularly to FIGS. 1–3, a preferred embodiment of the apparatus of the invention is illustrated.

FIG. 1 shows a block diagram of the residual magnetic field indicator of the present invention generally indicated at 10. The residual field indicator 10 comprises a waveform generator 12 connected to an amplifier 14. The waveform generator 12 is a square wave oscillator in the preferred embodiment, but any circuit capable of creating a predetermined signal could be employed. The amplifier 14 feeds into a motor terminal connection 18. A meter 22 is connected across the amplifier 14—motor terminal connection 18 interface. A frequency selector circuit 24 is also connected to the waveform generator 12. A switch 26, AC power supply 28 and DC power supply 30 are also included.

The waveform generator 12 sends a signal to the amplifier 14. The amplifier 14 amplifies the signal from the waveform generator 12 and feeds it into a motor 16 being tested by means of the motor terminal connection 18 which is used to attach the residual field indicator 10 to the motor 16. A motor terminal connection 18 connects the amplifier 14 to the motor 16 being tested and feeds the effect of the motor load into the amplifier 14 by means of a feedback loop 22. This feedback enables the residual magnetic field in the motor 16 to be determined. A meter 22 monitors the output of the amplifier 14 and the feedback of the motor 16 at the motor terminal connection 18.

The waveform generator 12 is a square wave oscillator in the preferred embodiment, but any circuit capable of creating a predetermined signal could be employed. Feedback to the amplifier 14 and meter 22 is dependent upon the frequency of the waveform and the output rating of the motor 16. A frequency selector circuit 24 connected to the waveform generator 12 allows the frequency of the waveform generator 12 to be selected, allowing motors of various sizes to be tested by the residual magnetic field indicator 10 of the present invention.

The residual field indicator 10 preferably includes a power selector switch 26 to enable a user to select either an AC power supply 28 or a DC power supply 30.

FIG. 2 shows a preferred embodiment of the residual field indicator device 10. A control panel 32 comprises a digital liquid crystal diode (LCD) meter 22, a meter switch 34, power switch 26, AC power switch 46, DC power switch 50, battery charger switch 56, a power indicator light 42, an AC indicator light 48, DC indicator light 52, battery charger indicator light 56, an AC power input 40 and a pulse train output 28.

The meter 22 reacts to the magnitude of magnetic field of the motor. The display of the meter 22 is controlled by the meter switch 34, which allows the meter 22 to be turned on or off. A motor interface 18 allows the residual field indicator 10 to be connected to a motor via probe clips 36. A frequency selector switch 38 controls the output frequency of the residual magnetic field indicator 10. A 115 Volt AC power input 40 is provided, and its use may be selected by a power selector switch 26. Use of external power is indicated by a power input indicator light 42. An AC power cord 44 is employed to connect the 115 VAC power input 40 to an external power outlet. An AC power switch 46 is used to send AC power to the circuit. AC power to the circuit is indicated by an AC indicator light 48. DC battery operation is selected by a DC power switch 50. A DC indicator light 52 allows a user to determine if the battery is draining. The DC battery may be charged by tripping a battery charger switch 54. A battery charger indicator light 56 is illuminated when a charge is being applied to the battery. Preferably, the residual magnetic field indicator 10 of the present invention is portable, and housed within a carrying case 58 with a hinged lid 60 to protect the control panel 32 during transport.

FIG. 3 shows a detailed schematic of the circuit of the preferred embodiment of the residual magnetic field indicator 10 of the present invention. Those of ordinary skill in the art will recognize that the function of the circuitry shown in FIG. 3 may be carried out by numerous circuit designs. Such other designs do not deviate from the spirit and scope of the invention, and the detailed circuit of FIG. 3 merely represents one of many circuit designs that may be used to construct the residual magnetic field indicator circuit of the present invention.

According to FIG. 3, the waveform generator 12 comprises a square wave oscillator 62 built around a 555 timer chip 64. A frequency selector circuit 24 is engaged to the square wave oscillator 62 and comprises a selection of 20-turn potentiometers 66 connected by a three-way frequency selector switch 38.

The square wave oscillator 62 using a 555 timer chip 64 is of a design customary in the art. A design also customary in the art is used to create the amplifier 14. The amplifier 14 is designed around a standard op amp 68, shown as a pair of cascaded TIP-147s in FIG. 3. The square wave oscillator 62 is connected to the base of the op amp 68 by means of a 1 kn resistor 70. The motor terminal connection 18 is connected to the emitter of the op amp 68 through a 5-watt resistor 72, which also connects to a meter 22, which is an LCD in the preferred embodiment. A meter switch 34, capacitor 78 and Zener diode 80 connect the meter 22 to the positive power rail 74 through a 3 kΩ resistor 76. A battery 30 and an AC power circuit 82 are connected to the residual magnetic field indicator 10 by a switch 26. Red LEDs 84 are connected to both the AC power circuit 82 and the battery 30. A battery charger circuit 86 is connected across the battery 30 and the positive rail 74 of the circuit 10.

In operation, the frequency selector circuit 24 controls the frequency of the square wave oscillator 62. The three-way frequency selector switch 38 selects which 20-turn potentiometer 66 will be used, thereby determining the frequency. The potentiometers 66 of the frequency selector circuit 24 are tuned to cause the square wave oscillator 62 to oscillate at frequencies of 300, 600, and 1200 Hz. The oscillating square wave signal from the square wave oscillator 62 is amplified by the amplifier 14. The amplified electronic signal flows to the motor terminal connection 18 from the emitter of the op amp 68 through a 5-watt resistor 72.

Power to the meter 22 is controlled by the meter switch 34 and is isolated and filtered by means of the capacitor 78 and regulated by the Zener diode 80. Power to the circuit is supplied by either the battery 30 or via an AC power souce connected to the AC power circuit 82. Use of either the battery 30 or the AC power circuit 82 is selected by means of a switch 26. Red LEDs 84 serve to indicate which source is active. When the AC power circuit 82 is connected, the battery 30 may be charged using a battery charger circuit 86. The inclusion of a battery 30 and an associated charger circuit 86 enhance the portability of the device.

Figure 4:
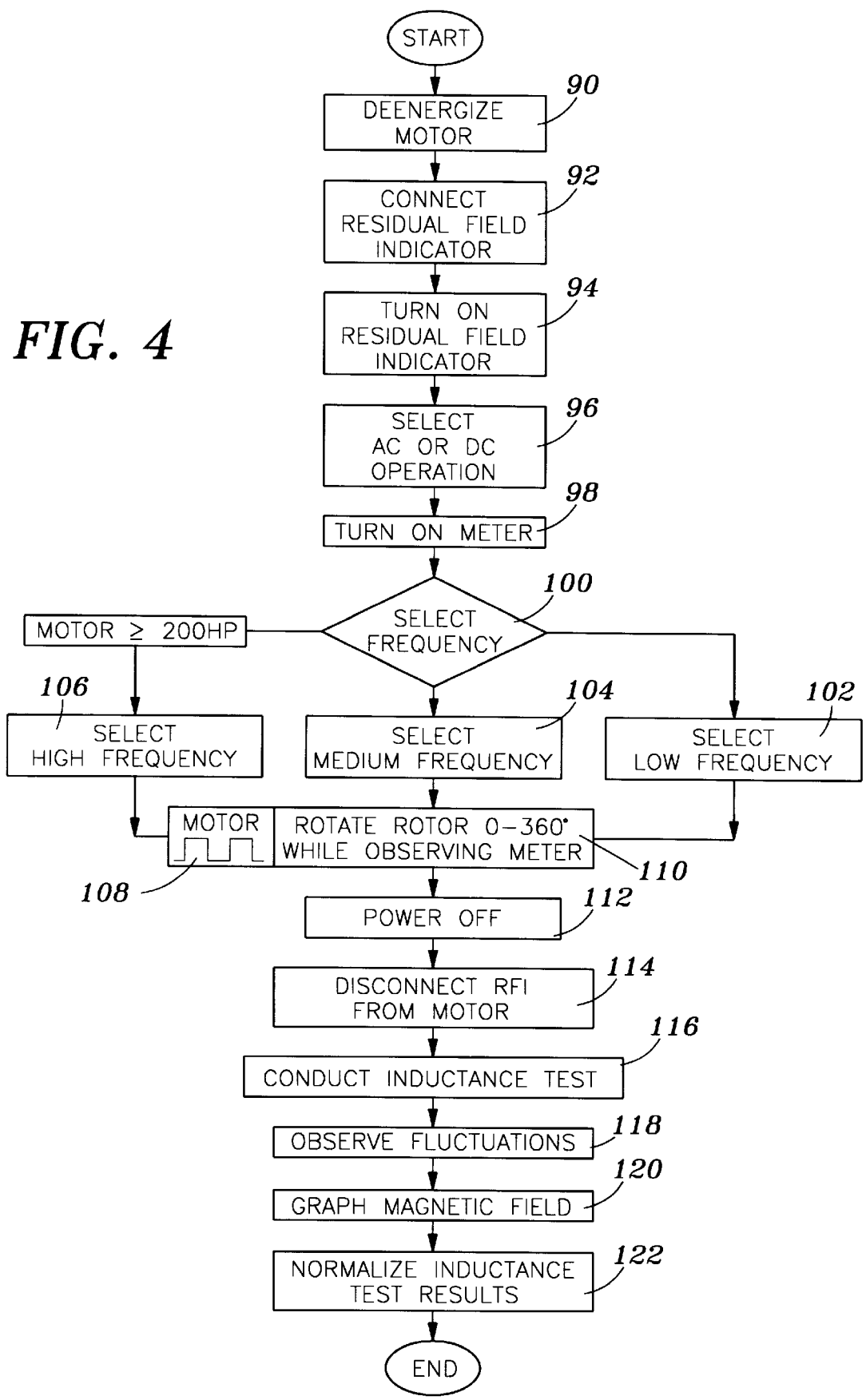
FIG. 4 is a flow chart detailing a preferred method of operating the residual field indicator according to the present invention.

FIG. 4 is a flowchart of a preferred method of practicing the invention. The first step of the process is to allow a motor to be tested to deenergize 90. Allowing the motor to deenergize not only allows a baseline residual magnetic field reading to be made, but is also a safety precaution to prevent a user of the invention from being shocked. Next, the residual magnetic field indicator of the present invention is connected 92 to the motor in order to measure the magnitude of the residual magnetic field of the motor. Preferably, the residual magnetic field indicator is portable, allowing it to be placed near the motor to be tested. To measure the magnitude of the residual magnetic field of the motor, a source of power is selected 94 and the residual magnetic field indicator is turned on 96. According to a preferred embodiment of the residual magnetic field indicator of the present invention, the power source may be supplied by either a DC battery or an AC power source. The meter is then started 98.

Input frequency is selected 100 based on the rated output of the motor. If the motor is rated at less than 50 horsepower (HP), a low frequency is selected 102, preferably 300 Hz. For motors rated between 50 and 200 HP, a medium frequency is selected 104, preferably 600 Hz. For motors rated at more than 200 HP, a high frequency, is selected, 106, preferably 1200 Hz. A square wave of the selected frequency is fed into the motor 108. The motor rotor is rotated completely while the meter is observed 110. Multiple readings are observed while the rotor is rotated, and the results are recorded with respect to the position of the rotor. According to the present invention, these readings are manually recorded on paper or manually input into a laptop computer. However, such meter readings may also be recorded by feeding the meter output directly into a computer, via a serial or SCSI port interface, for example. The multiple readings may be used to plot a continuous chart or sinusoidal graph of the magnetic field observed by the meter with respect to rotor position. The residual field indicator is then turned off 112 and disconnected 114. A standard inductance test is then conducted 116 on the motor, and inductance test fluctuations are observed 118. The standard inductance test may be performed using any of several devices, well known to those of ordinary skill in the art such as a device marketed by PdMA Corporation of Tampa, Fla., known as the MCE™ System 3000 Motor Circuit Evaluator. The fluctuations of the inductance test allow the peaks and poles of the magnetic field, observed by the extreme magnitudes of the meter, to be classified by matching the high and low fluctuations of the inductance test with the extreme magnitudes of the residual magnetic field indicator. High fluctuations indicate peaks while low fluctuations indicate poles. Using this information, a polar graph of the magnetic field is made 120. This graph may be made by computer or manually using a Smith chart. The graph allows the inductance test results to be normalized 122, resulting in a more accurate test.

While preferred embodiments of the present invention have been shown and described, it will be understood by those of ordinary skill in the art that various changes and modifications may be made without departing from the spirit and scope of the invention which is defined by the appended claims.

What is claimed is:

1. Apparatus for detecting a residual magnetic field in a dynamoelectric machine comprising:

an interface for connecting said apparatus to said dynamoelectric machine;

a waveform generator connected to said interface for sending an electronic signal to said machine via said interface;

a detector coupled to said waveform generator and connected to said interface for detecting disturbances in said signal created by the residual magnetic field of said machine;

a power supply coupled to said detector and to said waveform generator for providing power thereto.

2. The device of claim 1 wherein said detector comprises an amplifier, said amplifier amplifying said electronic signal and receiving feedback from said machine.

3. The device of claim 2 wherein said waveform generator comprises a square wave oscillator.

4. The device of claim 3 wherein said square wave oscillator further comprises a frequency selection device coupled to said oscillator.

5. The device of claim 1 further comprising a meter coupled to said detector to report said changes in said signal.

6. The device of claim 1 wherein said power supply comprises a battery.

7. The device of claim 5 wherein said power supply comprises a rechargeable battery and charging means for charging said rechargeable battery.

8. The device of claim 1 wherein said power supply comprises:

a DC power supply comprising a battery;

an AC power attachment comprising a connector for connecting said device to an AC power source and a matching transformer coupled to said connector; and a switch attached to said detector and to said waveform generator and coupled between said DC power supply and said transformer of said AC power attachment.

9. A method for testing a dynamoelectric machine having a rotor therein, comprising:

measuring a magnitude of a residual magnetic field emitted by said machine;

conducting an inductance test on said machine;

offsetting the results of said inductance test by said magnitude.

10. The method of claim 9 further comprising recording said magnitude of said magnetic field.

11. The method of claim 9 wherein said step of measuring a magnitude of a residual magnetic field comprises:

applying a predetermined electrical waveform to said machine;

employing feedback from said machine to influence said predetermined electrical waveform input;

using variations in said predetermined electrical waveform caused by said feedback to determine said magnitude of said residual magnetic field.

12. The method of claim 11 wherein said predetermined electrical waveform is a square wave.

13. The method of claim 12 wherein said square wave is assymmetrical.

14. The method of claim 13 wherein said square wave has a predetermined variable pulse width.

15. The method of claim 11 wherein said waveform is applied at a plurality of frequencies.

16. The method of claim 10 wherein said step of recording said magnitude of said magnetic field comprises:

rotating said rotor;

observing a plurality of magnitudes of said magnetic field with respect to said rotation of said rotor;

charting said plurality of magnitudes with respect to rotation of said rotor to create a continuous graph of magnetic field magnitude versus rotor position.

17. The method of claim 16 wherein said step of charting comprises:

collecting extreme multitude samples of said magnetic field;

observing fluctuations in said inductance test as said rotor is rotated;

matching said extremes with said fluctuations to create a polar chart of said magnetic field.

18. The method of claim 9 wherein said dynamoelectric machine comprises a motor.

19. The method of claim 11 wherein said rotor is a round rotor.

\* \* \* \* \*